(12) United States Patent
Hede et al.

(10) Patent No.: US 6,453,425 B1
(45) Date of Patent: Sep. 17, 2002

(54) METHOD AND APPARATUS FOR SWITCHING CLOCKS PRESENTED TO SYNCHRONOUS SRAMS

(75) Inventors: Michael R. Hede; Jeffrey M. Rogers; Stephen M. Johnson, all of Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/448,793

(22) Filed: Nov. 23, 1999

(51) Int. Cl.[7] .............................................. G06F 1/04
(52) U.S. Cl. ........................................ 713/501; 327/99
(58) Field of Search ................................ 713/400, 500, 713/501; 327/99, 298

(56) References Cited

U.S. PATENT DOCUMENTS

| | | | |
|---|---|---|---|
| 4,627,032 A | 12/1986 | Kolwicz et al. | 365/203 |
| 4,855,615 A | 8/1989 | Humpleman | 307/269 |
| 4,870,299 A | 9/1989 | Chen | 307/269 |
| 5,099,140 A * | 3/1992 | Mudgett | 327/144 |
| 5,099,141 A | 3/1992 | Utsunomiya | 307/269 |
| 5,179,667 A * | 1/1993 | Iyer | 711/167 |
| 5,274,678 A | 12/1993 | Ferolito et al. | 375/108 |
| 5,291,528 A | 3/1994 | Vermeer | 375/106 |
| 5,315,181 A | 5/1994 | Schowe | 307/480 |
| 5,357,146 A | 10/1994 | Heimann | 307/269 |
| 5,448,597 A * | 9/1995 | Hashimoto | 375/354 |
| 5,483,185 A | 1/1996 | Scriber et al. | 327/99 |
| 5,564,042 A * | 10/1996 | Ventrone et al. | 713/501 |
| 5,574,753 A | 11/1996 | Vartti et al. | 375/357 |
| 5,604,452 A | 2/1997 | Huang | 327/99 |
| 5,623,223 A | 4/1997 | Pasqualini | 327/298 |
| 5,652,536 A | 7/1997 | Nookala et al. | 327/298 |
| 5,703,507 A | 12/1997 | Siebert | 327/99 |
| 5,790,609 A | 8/1998 | Swoboda | 375/357 |
| 5,811,995 A | 9/1998 | Roy et al. | 327/99 |
| 6,049,236 A * | 4/2000 | Walden | 327/99 |

* cited by examiner

*Primary Examiner*—Dennis M. Butler
(74) *Attorney, Agent, or Firm*—Christopher P. Maiorana, PC

(57) ABSTRACT

A method and apparatus for switching clocks comprising a first circuit, a second circuit, and a third circuit. The first circuit may be configured to generate (i) a first signal in response to a select signal and a first clock signal, (ii) a second signal in response to said first signal and a second clock signal, (iii) a third signal in response to said select signal and said second clock signal, and (iv) a fourth signal in response to said third signal and said first clock signal. The second circuit may be configured to generate a first enable signal and a second enable signal in response to (i) said first signal, (ii) said second signal, (iii) said third signal, and (iv) said fourth signal. The third circuit may be configured to select (i) one or more first input signals, (ii) one or more second input signals, or (iii) a predetermined logic level as one or more output signals in response to said first enable signal and said second enable signal.

17 Claims, 5 Drawing Sheets

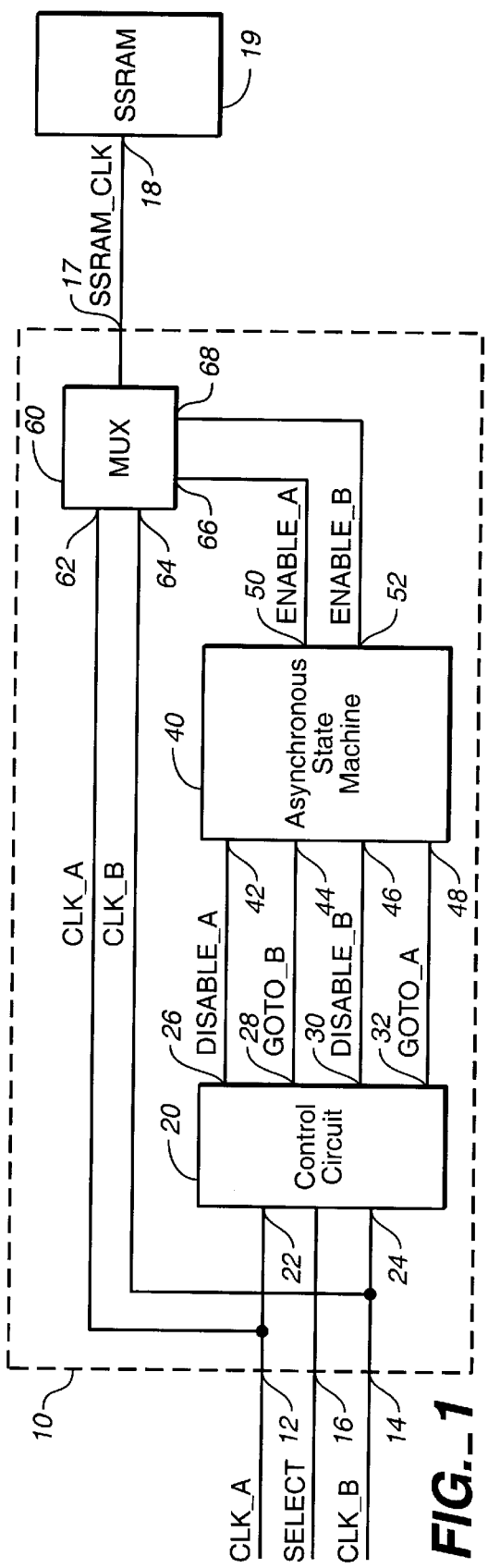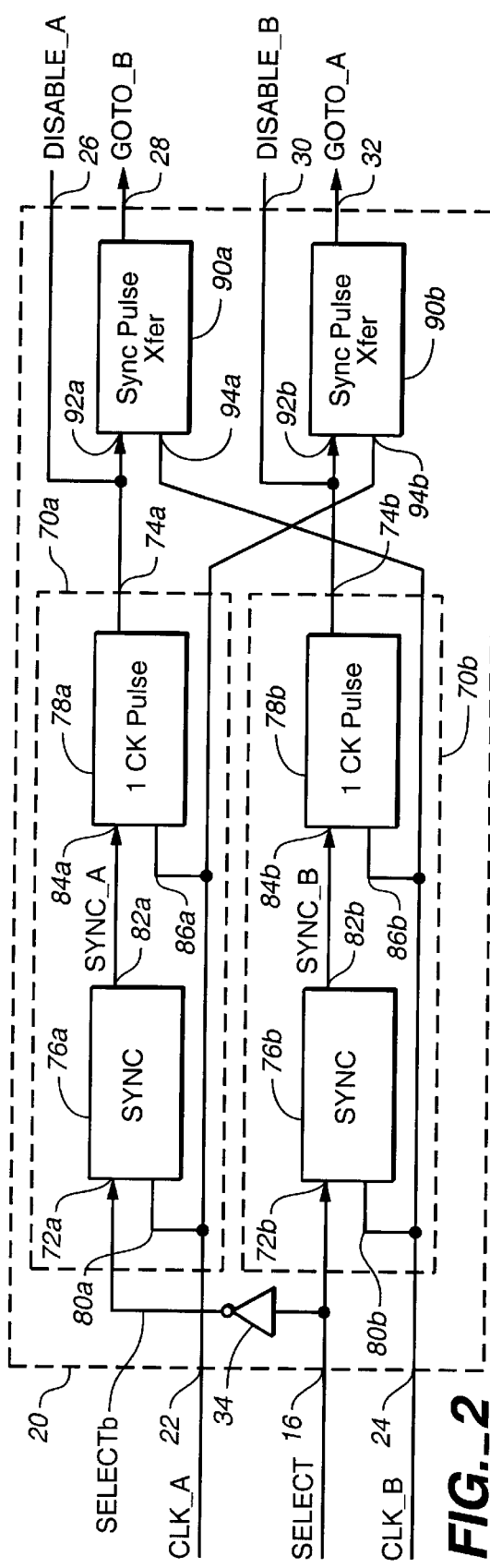

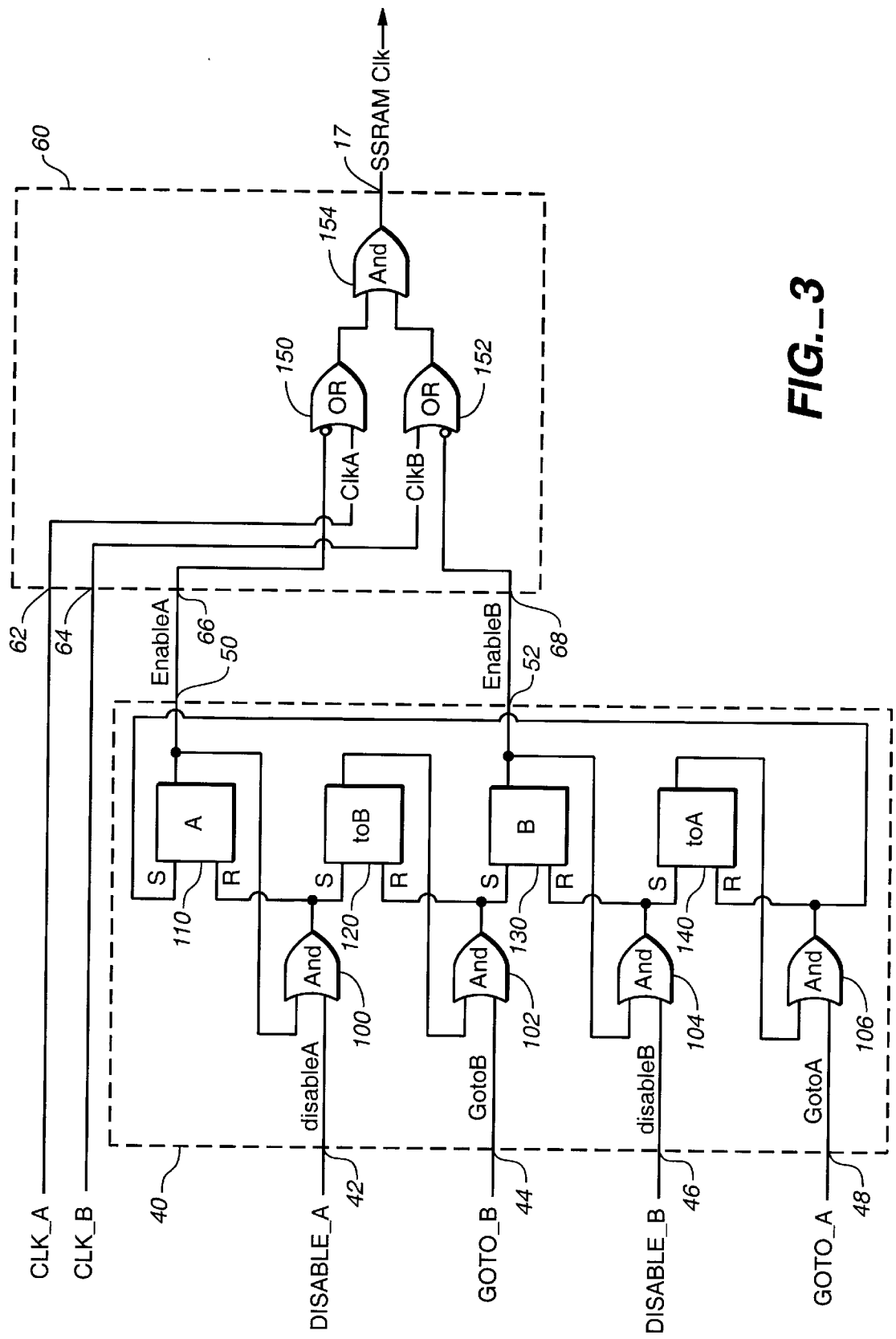
FIG._3

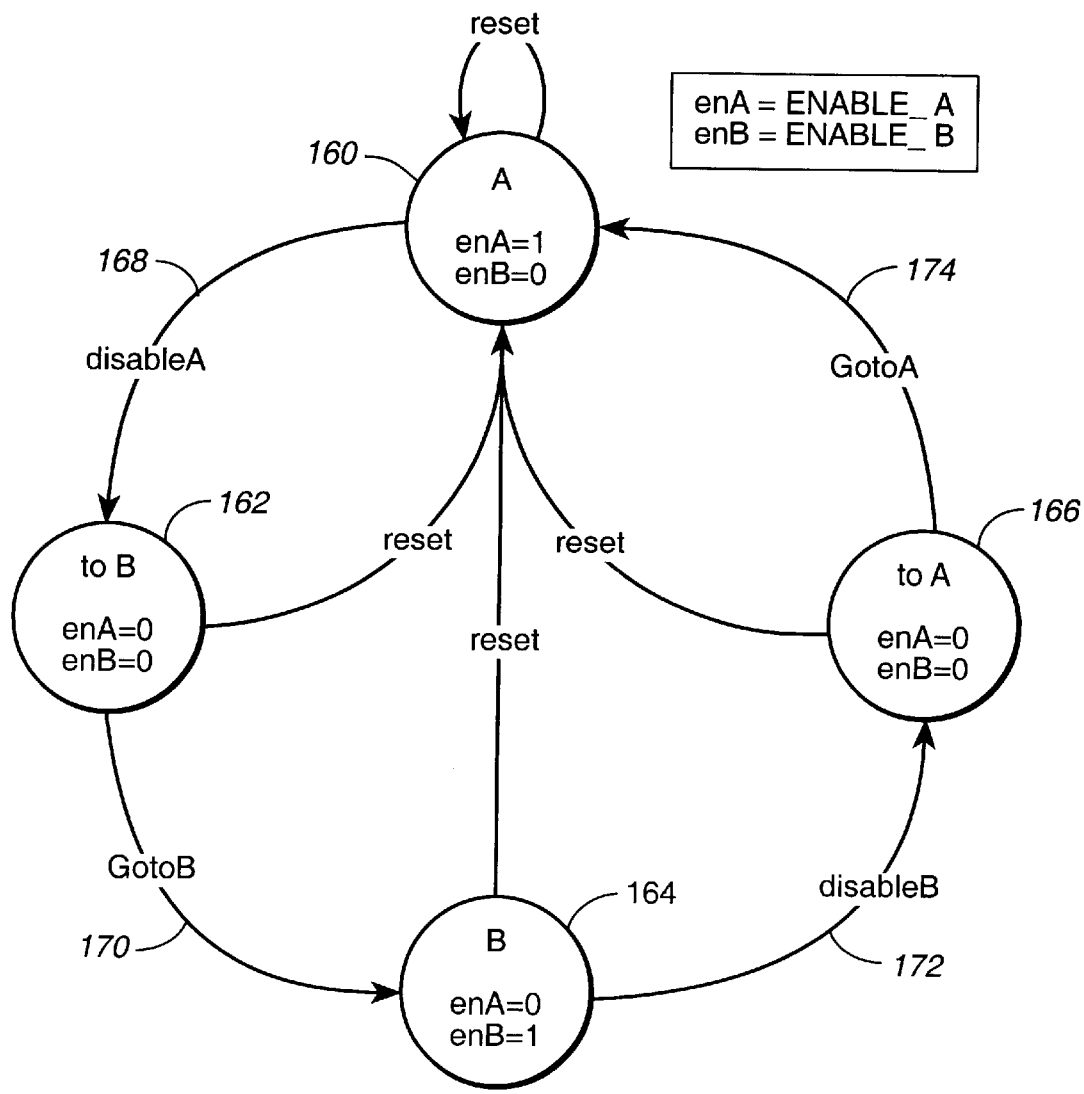
FIG._4

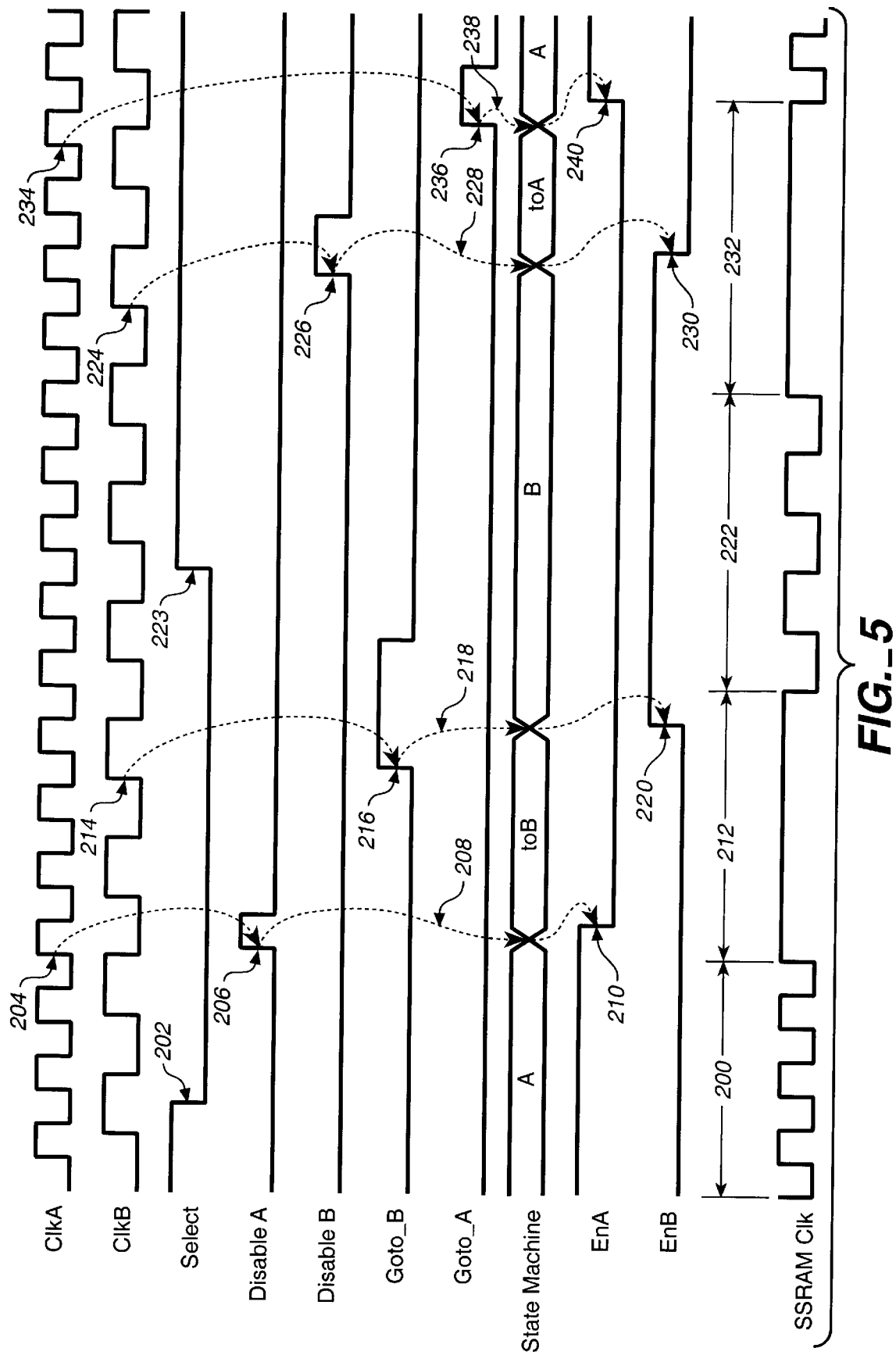
FIG._5

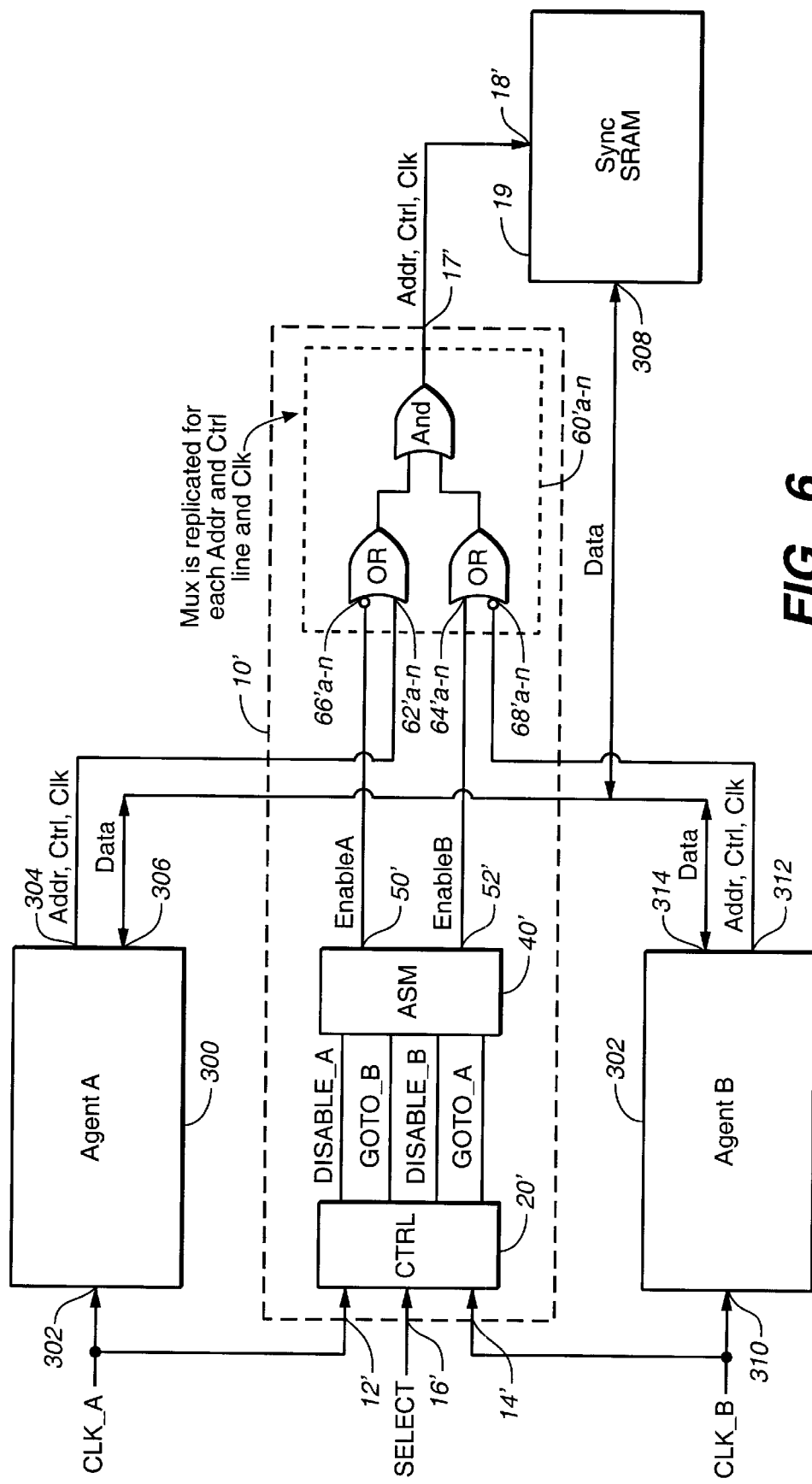
FIG._6

METHOD AND APPARATUS FOR SWITCHING CLOCKS PRESENTED TO SYNCHRONOUS SRAMS

FIELD OF THE INVENTION

The present invention relates to clock switching circuits generally and, more particularly, to a method and apparatus for switching clocks presented to synchronous static random access memories (SRAMS).

BACKGROUND OF THE INVENTION

Synchronous SRAMs have an input clock that is used to time accesses to the RAM. The clock provides the timing requirements for address, data, and control signals with respect to setup, hold and access times. The clock is used internally to, among other things, latch address, data, and control inputs and to pre-charge internal nodes.

In a totally synchronous environment, all access to a synchronous SRAM comes from one or more agents running on a common system clock. The common system clock can be used as the input clock to the synchronous SRAM. In an asynchronous environment, agents run in different time domains. The input clock to the synchronous SRAM must be switched to the clock of the agent seeking access. Switching the input clock can cause problems (e.g., violations of the synchronous SRAM's input clock timing requirements, glitches, and/or runt pulses). Violating input timing requirements, glitches, and/or runt pulses can result in loss of data, invalid data, and or a system hang.

Prior designs avoided such timing problems by using Asynchronous RAMs. Asynchronous RAMs do not require a clock input. However, synchronous SRAMs are desirable in many applications even though access would be required by agents running in different time domains.

A solution is needed for switching the input clock. and/or control signals of a synchronous SRAM without glitches, runt pulses, and/or timing violations.

SUMMARY OF THE INVENTION

The present invention concerns a method and apparatus for switching clocks comprising a first circuit, a second circuit, and a third circuit. The first circuit may be configured to generate (i) a first signal in response toga select signal and a first clock signal, (ii) a second signal in response to the first signal and a second clock signal, (iii) a third signal in response to the select signal and the second clock signal, and (iv) a fourth signal in response to the third signal and the first clock signal. The second circuit may be configured to generate a first enable signal and a second enable signal in response to (i) the first signal, (ii) the second signal, (iii) the third signal, and (iv) the fourth signal. The third circuit may be configured to select (i) one or more first input signals, (ii) one or more second input signals, or (iii) a predetermined logic level as one or more output signals in response to the first enable signal and the second enable signal.

The objects, features and advantages of the present invention include providing a method and/or apparatus that may switch clocks presented to one or more memories (e.g., synchronous SRAMs) without (i) violating timing requirements, (ii) generating glitches, and/or (iii),generating runt pulses.

BRIEF DESCRIPTION OF THE DRAWINGS

These and other objects, features and advantages of the present invention will be apparent from the following detailed description and the appended claims and drawings in which:

FIG. 1 is a block diagram of a preferred embodiment of the present invention;

FIGS. 2 and 3 are more detailed block diagrams of portions of the circuit of FIG. 1;

FIG. 4 is a state diagram illustrating the operation of the asynchronous state machine of FIG. 1;

FIG. 5 is a timing diagram illustrating various signals of the circuit of FIG. 1; and FIG. 6 is a block diagram illustrating an alternative embodiment.

DETAILED DESCRIPTION OF THE PREFERRED EMBODIMENTS

Referring to FIG. 1, a block diagram of a circuit 10 illustrating a preferred embodiment of the present invention is shown. The circuit 10 may be implemented, in one example, as a clock switching circuit. The circuit 10 may have an input 12, an input 14, an input 16, and an output 17. The input 12 may receive a first clock signal (e.g., CLK_A). The input 14 may receive a second clock signal (e.g., CLK_B). The input 16 may receive a control signal (e.g., SELECT). The circuit 10 may be configured to generate an output signal (e.g., SSRAM_CLK) at the output 17 in response to (i) the signal CLK_A, (ii) the signal CLK_B, and (iii) the signal SELECT. The circuit 10 may be configured to select (i) the signal CLK_A, (ii) the signal CLK_B, or (iii) a predetermined logic level, as the signal SSRAM_CLK.

When the predetermined logic level is selected, the signal SSRAM_CLK may be, in one example, a HIGH logic level. However, other logic levels may be implemented to meet the design criteria of a particular application. For example, the predetermined logic level may be selected as an inactive state of a clock input of a synchronous SRAM. The output 17 may be connected to a clock input 18 of one or more synchronous SRAM chips 19.

The circuit 10 generally comprises a circuit 20, a circuit 40, and a circuit 60. The circuit 20 may be implemented, in one example, as a control circuit. The circuit 40 may be implemented, in one example, as a 4-state asynchronous state machine. The circuit 60 may be implemented, in one example, as a multiplexer circuit.

The circuit 20 may be configured to receive (i) the signal CLK_A at an input 22, (ii) the signal CLK_B at an input 24, and (iii) the signal SELECT from the input 16. The circuit 20 may be configured to generate a first signal (e.g., DISABLE_A) at an output 26 in response to (i) the signal CLK_A, and (ii) the signal SELECT. The signal DISABLE_A may be equivalent to a single pulse (e.g., one half of the period) of the signal CLK_A. The circuit 20 may be configured to generate a second signal (e.g., GOTO_B) at an output 28 in response to (i) the signal DISABLE_A and (ii) the signal CLK_B. The signal GOTO_B may be equivalent to a single pulse (e.g., one half of the period) of the signal CLK_B. The circuit 20 may be configured to generate a third signal (e.g., DISABLE_B) at an output 30 in response to (i) the signal CLK_B and (ii) the signal SELECT. The signal DISABLE_B may be equivalent to a single pulse (e.g., one half of the period) of the signal CLK_B. The circuit 20 may be configured to generate a fourth signal (e.g., GOTO_A) at an output 32 in response to (i) the signal DISABLE_B and (ii) the signal CLK_A. The signal GOTO_A may be equivalent to a single pulse (e.g., one half of the period) of the signal CLK_A. The signals DISABLE_A, DISABLE_B, GOTO_A, and GOTO_B may be control signals.

The circuit 40 may receive the signal DISABLE_A at an input 42, the signal GOTO_B at an input 44, the signal DISABLE_B at an input 46 and the signal GOTO_A at an input 48. The circuit 40 may be configured to generate a first control signal (e.g., ENABLE_A) at an output 50 and a second control signal (e.g., ENABLE_B) at an output 52 in response to the sequence of presentation of (i) the signal DISABLE_A, (ii) the signal GOTO_B, (iii) the signal DISABLE_B, and (iv) the signal GOTO_A.

The circuit 60 may receive the signal CLK_A at an input 62, the signal CLK_B at an input 64, the signal ENABLE_A at an input 66, and the signal ENABLE_B at an input 68. The circuit 60 may be configured to present the signal CLK_A, the signal CLK_B or a predetermined logic state as the signal SSRAM_CLK in response to the signal ENABLE_A and/or the signal ENABLE_B.

Referring to FIG. 2, a more detailed block diagram of the circuit 20 is shown. The circuit 20 generally comprises a gate 34, a circuit 70a, a circuit 70b, a circuit 90a, and a circuit 90b. The gate 34 may be implemented, in one example, as an inverter. However, other types of gates may be implemented accordingly to meet the design criteria of a particular application. The circuits 70a and 70b may be, in one example, synchronous pulse generator circuits. The circuits 90a and 90b may be, in one example, asynchronous pulse transfer circuits. The circuits 90a and 90b may be configured to convert a pulse from a first clock domain into a pulse that (i) generally has a width equal to the period of the first clock domain and (ii) is generally synchronized to a second clock domain.

The signal SELECT is generally presented to the gate 34 and to an input 72b of the circuit 70b. The gate 34 generally presents a digital complement of the signal SELECT (e.g., SELECTb) to an input 72a of the circuit 70a. The circuit 70a may be configured to generate the signal DISABLE_A at an output 74a in response to the signal CLK_A and the signal SELECTb.

The signal DISABLE_A is generally presented to an input 92a of the circuit 90a. The signal CLK_B is generally presented to an input 94a of the circuit 90a. The circuit 90a may be configured to generate the signal GOTO_B in response to the signal DISABLE_A and the signal CLK_B.

The circuit 70b may be configured to generate the signal DISABLE_B at an output 74b in response to the signal SELECT and the signal CLK_B. The signal DISABLE_B is generally presented to an input 92b of the circuit 90b. The signal CLK_A is generally presented to an input 94b of the circuit 90b. The circuit 90b may be configured to generate the signal GOTO_A in response to the signal CLK_A and the signal DISABLE_B.

The circuit 70a generally comprises a circuit 76a and a circuit 78a. The circuit 76a may be implemented, in one example, as a synchronizing circuit. The circuit 78a may be implemented, in one example, as a one-clock-pulse generator circuit. The circuit 76a may be configured to generated a trigger signal (e.g., SYNC_A) by synchronizing the signal SELECTb to the signal CLK_A. The circuit 78a may be configured to generate the signal DISABLE_A in response to a positive transition of the signal SYNC_A.

The circuit 70b generally comprises a circuit 76b and a circuit 78b. The circuit 76b may be implemented, in one example, as a synchronizing circuit. The circuit 78b may be implemented, in one example, as a one-clock-pulse generator circuit. The circuit 76b may be configured to generated a trigger signal (e.g., SYNC_B) by synchronizing the signal SELECTb to the signal CLK_B. The circuit 78b may be configured to generate the signal DISABLE_B in response to a positive transition of the signal SYNC_B.

Referring to FIG. 3, a more detailed diagram of the circuit 40 and the circuit 60 is shown. The circuit 40 generally comprises a gate 100, a gate 102, a gate 104, a gate 106, an S-R latch 110, an S-R latch 120, an S-R latch 130, and an S-R latch 140. The gates 100, 102, 104, and 106 may be implemented, in one example, as two-input AND gates. However, other types of gates may be implemented accordingly to meet the design criteria of a particular application. The S-R latches 110, 120, 130, and 140 may be implemented, in one example, as asynchronous cross-coupled NAND cells with positive inputs and outputs. However, other types of memory devices may be implemented accordingly to meet the design criteria of a particular implementation.

The signal DISABLE_A is generally presented to a first input of the gate 100. An output of the gate 100 is generally connected to (i) an R-input of the S-R latch 110 and (ii) an S input of the S-R latch 120. An output of the S-R latch 110 is generally connected to a second input of the gate 100 and the output 50. The signal ENABLE_A is generally presented as the output of the S-R latch 110. The signal GOTO_B is generally presented to a first input of the gate 102. An output of the gate 102 is generally connected to (i) an R-input of the S-R latch 120 and (ii) an S-input of the S-R latch 130. An output of the S-R latch 120 is generally connected to a second input of the gate 102. The signal DISABLE_B is generally presented to a first input of the gate 104. An output of the gate 104 is generally connected to (i) an R-input of the S-R latch 130 and (ii) an S-input of the S-R latch 140. An-output of the S-R latch 130 is generally connected to a second input of the gate 104 and the output 52. The signal ENABLE_B is generally presented as the output of the gate 130. The signal GOTO A is generally presented to a first input of the gate 106. An output of the gate 106 is generally connected to (i) an R-input of the S-R latch 140 and (ii) and S-input of the S-R latch 110. An output of the S-R latch 140 is generally connected to a second input of the gate 106.

The circuit 60 generally comprises, in one example, a gate 150, a gate 152, and a gate 154. The gates 150 and 152 may be implemented, in one example, as 2-input OR gates where a first input is an inverting input and a second input is a non-inverting input. However, other types of gates may be implemented accordingly to meet the design criteria of a particular application. The gate 154 may be implemented, in one example, as a 2-input AND gate. However, other types of gates may be implemented to meet the design criteria of a particular application. The signal ENABLE_A is generally present to the inverting input of the gate 150. The signal CLK_A is generally presented to the non-inverting input of the gate 150. The signal CLK_B is generally presented to the non-inverting input of the gate 152. The signal ENABLE_B is generally presented to the inverting input of the gate 152. An output of the gate 150 is generally connected to a first input of the gate 154. An output of the gate 152 is generally connected to a second input of the gate 154. The signal SSRAM_CLK is generally presented at an output of the gate 154.

Referring to FIG. 4, a state diagram illustrating the operation of the circuit 40 is shown. The state machine 40 may have four states: (i) a state A 160, (ii) a state ToB 162, (iii) a state B 164, and (iv) a state ToA 166. The state machine 40 generally starts up and/or resets to the state A 160. When the state machine 40 is in the state A 160, the signal ENABLE_A is generally asserted (e.g., a logic "1", or HIGH) and the signal ENABLE_B is generally not asserted (e.g., a logic "0", or LOW). The state machine 40 will generally remain in the state A 160 until the signal DISABLE_A is received. When the signal DISABLE_A is received, the state machine 40 will generally move to the state ToB 162 (e.g., arrow 168). When the state machine 40 is in the state ToB 162, the signal ENABLE_A and the signal ENABLE_B are generally LOW. The state machine 40 will generally remain in the state ToB 162 until the signal GOTO_B is received. When the signal GOTO_B is received, the state machine 40 will generally move to the state B 164 (e.g., arrow 170). When the state machine 40 is in the state B 164, the signal ENABLE_A is generally LOW and the signal ENABLE_B is generally HIGH. The state machine 40 will generally remain in the state B 164 until the signal DISABLE_B is received. When the signal DISABLE_B is received, the state machine 40 will generally move to the state ToA 166 (e.g., arrow 172). When the state machine 40 is in the state ToA 166, the signal ENABLE_A and the signal ENABLE_B are generally LOW. The state machine 40 will generally remain in the state ToA 166 until the signal GOTO_A is received. When the signal GOTO_A is received, the state machine 40 will move to the state A 160 (e.g., arrow 174), as described above, and the cycle will repeat. The states 160, 162, 163 and 164 generally have a single entry point and a single exit point. The order in which the machine moves through the states is normally fixed. However, upon a reset the state machine 40 will generally move to the state A 160.

Referring to FIG. 5, a timing diagram illustrating various signals generated by the circuit 10 is shown. Initially, the signal SELECT is generally HIGH and the circuit 40 is generally in the state A 160 (as described in connection with FIG. 4). When the signal ENABLE_A is HIGH, the signal SSRAM_CLK tracks the signal CLK_A as shown during an active portion 200. Following a negative transition 202 of the signal SELECT, a positive transition 204 of the signal CLK_A is generally followed by (i) the generation of the signal DISABLE_A 206, (ii) the circuit 40 changing to the state ToB 208, (iii) a negative transition 210 of the signal ENABLE_A, and (iv) the signal SSRAM_CLK becoming inactive during a portion 212. Following the generation of the signal DISABLE_A 206, a positive transition 214 of the signal CLK_B is generally followed by (i) the generation of the signal GOTO_B 216, (ii) the circuit 40 changing state to the state B 218 and (iii) a positive transition 220 of the signal ENABLE_B. When the signal ENABLE_B is HIGH, the signal SSRAM_CLK generally tracks the signal CLK_B as shown during the active portion 222.

Following a positive transition 223 of the signal SELECT, a positive transition 224 of the signal CLK_B is generally followed by (i) the generation of the signal DISABLE_B 226, (ii) the circuit 40 changing state to the state ToA 228, (iii) a negative transition 230 of the signal ENABLE_B, and (iv) the signal SSRAM_CLK becoming inactive during a portion 232. Following the signal DISABLE_B 226, a positive transition 234 of the signal CLK_A is generally followed by (i) the generation of the signal GOTO_A 236, (ii) the circuit 40 changing state to the state A 238 and (iii) a positive transition 240 of the signal ENABLE_A.

The transitions 210 and 220 of the signal ENABLE_A and the signal ENABLE_B, respectively, generally occur during the inactive portion 212 of the signal SSRAM_CLK. The transitions 230 and 240 of the signal ENABLE_B and ENABLE_A, respectively, generally occur during the inactive portion 232 of the signal SSRAM_CLK. The circuit 10 generally synchronizes the transitions 210 and 240 of the signal ENABLE_A to the signal CLK_A. The circuit 10 generally synchronizes the transitions 220 and 230 of the signal ENABLE_B to the signal CLK_B.

Referring to FIG. 6, a diagram of a circuit 10' illustrating an alternative embodiment is shown. The circuit 10' is generally implemented similarly to the circuit 10 except that the multiplexer 60' of the circuit 10' generally comprises replicas of the multiplexer 60 of the circuit 10. The signal ENABLE_A is generally presented to a plurality of inputs 66'a–66'n. The signal ENABLE_B is generally presented to a plurality of inputs 68'a–68'n. The circuit 10' may be configured to select a plurality of control signals from (i) an agent 300 or (ii) an agent 302 for presentation to the synchronous SRAM 19. The selected plurality of control signals may be presented at an output 17' of the circuit 10'. The output 17' may be n-bits wide. The output 17' is generally connected to an input 18' of the synchronous SRAM 19.

The agent 300 generally receives the signal CLK_A at an input 302. The agent 300 may be configured to present a plurality of output signals at an output 304. The plurality of output signals may include address, control and/or clock signals. The output 304 is generally connected to a plurality of inputs 62'a–62'n of the circuit 10'. One or more data signals (e.g., DATA) may be sent from or received at an input/output 306 of the circuit 300. The input/output 306 may be connected to an input/output 308 of the SRAM 19. The input/output 308 may be one or more bits wide.

The signal CLK_B is generally presented to an input 310 of the agent 302. A plurality of output signals may be presented at an output 312 of the agent 302. The plurality of output signals may include address, control, and/or clock signals. The plurality of output signals is generally presented to a plurality of inputs 64'a–64'n of the circuit 10'. One or more data signals may be sent from or received at an input/output 312 of the agent 302. The input/output 312 may be connected to the input/output 308 of the synchronous SRAM 19.

When the signal SELECT is in a first state, (i) one or more control signals from the agent 300 will generally be presented to the SRAM 19 and (ii) data may be transferred between the agent 300 and the SRAM 19. When the signal SELECT is in a second state, (i) one or more control signals from the agent 302 will generally be presented to the SRAM 19 and (ii) data may be transferred between the agent 302 and the SRAM 19.

The present invention has been described using an example illustrating switching between a first and a second clock signal. However, the present invention may be configured to switch between more than two clock signals. For example, if switching between more than two clock signals is needed, the state machine 40 may be modified to accommodate additional states. In an example where the number of clocks is a binary multiple greater than 2 (e.g., 4, 16, 32, etc.) a cascading of the circuit 10 may result in switching of four or more clocks. For example, to switch between four clocks, (i) two clocks may be presented to a first version of the circuit 10, (ii) two more clocks may be presented to a second version of the circuit 10, and (iii) the outputs of the first and second version of the circuit 10 may be presented to the inputs of a third version of the circuit 10.

While the invention has been particularly shown and described with reference to the preferred embodiments thereof, it will be understood by those skilled in the art that various changes in form and details may be made without departing from the spirit and scope of the invention. For example, the present invention may be implemented in hardware, firmware, and/or software to meet the design criteria of a particular application.

What is claimed is:

1. An apparatus comprising:
   a first circuit configured to generate (i) a first signal in response to a select signal and a first clock signal, (ii) a second signal in response to said first signal and a second clock signal, (iii) a third signal in response to said select signal and said second clock signal, and (iv) a fourth signal in response to said third signal and said first clock signal;
   a second circuit configured to generate a first enable signal and a second enable signal in response to (i) said first signal, (ii) said second signal, (iii) said third signal, and (iv) said fourth signal; and
   a third circuit configured to select (i) one or more first input signals, (ii) one or more second input signals, or (iii) a predetermined logic level as one or more output signals in response to said first enable signal and said second enable signal, wherein said first enable signal and said second enable signal have transitions only when said one or more output signals are at said predetermined logic level.

2. The apparatus according to claim 1, wherein said second circuit comprises a state machine.

3. The apparatus according to claim 2, wherein said state machine comprises a 4-state asynchronous state machine.

4. The apparatus according to claim 1, wherein one of said one or more output signals is a clock signal presented to a clock input of one or more memories.

5. The apparatus according to claim 4, wherein said one or more memories comprise one or more synchronous SRAMs.

6. The apparatus according to claim 4, wherein said predetermined logic level comprises an inactive state of said clock input.

7. The apparatus according to claim 1, wherein said third circuit selects said one or more first input signals or said one or more second input signals only after a selection of said predetermined logic level.

8. The apparatus according to claim 1, wherein said first circuit comprises:
   a first synchronizing circuit and a first pulse generation circuit configured to generate said first signals; and
   a second synchronizing circuit and a second pulse generation circuit configured to generate said third signal.

9. The apparatus according to claim 8, further comprising:
   a third synchronizing circuit configured to generate said second signal in response to said first signal and said second clock signal; and
   a fourth synchronizing circuit configured to generate said fourth signal in response to said third signal and said first clock signal.

10. The apparatus according to claim 1, wherein:
    said first circuit comprises (i) a first synchronizing circuit, (ii) a first one-clock-pulse generator circuit, (iii) a first sync pulse transfer circuit, (iv) a second synchronizing circuit, (v) a second one-clock-pulse generator circuit, (vi) a second sync pulse transfer circuit; and
    said second circuit comprises (i) a first AND gate, (ii) a second AND gate, (iii) a third AND gate, (iv) a fourth AND gate, (v) a first S-R latch, (vi) a second S-R latch, (vii) a third S-R latch, and (viii) a fourth S-R latch; and
    said third circuit comprises (i) a first OR gate, (ii) a second OR gate, and (iii) an AND gate.

11. An apparatus comprising:
    means for generating (i) a first signal in response to a select signal and a first clock signal, (ii) a second signal in response to said first signal and a second clock signal, (iii) a third signal in response to said select signal and said second clock signal, and (iv) a fourth signal in response to said third signal and said first clock signal;
    means for generating a first enable signal and a second enable signal in response to (i) said first signal, (ii) said second signal, (iii) said third signal, and (iv) said fourth signal; and
    means for selecting (i) one or more first input signals, (ii) one or more second input signals, or (iii) a predetermined logic level as one or more output signals in response to said first enable signal and said second enable signal, wherein said first enable signal and said second enable signal have transitions only when said one or more output signals are at said predetermined logic level.

12. A method for switching clocks presented to a memory comprising the steps of:
    (A) generating (i) a first signal in response to a select signal and a first clock signal, (ii) a second signal in response to said first signal and a second clock signal, (iii) a third signal in response to said select signal and said second clock signal, and (iv) a fourth signal in response to said third signal and said first clock signal;
    (B) generating a first enable signal and a second enable signal in response to (i) said first signal, (ii) said second signal, (iii) said third signal, and (iv) said fourth signal; and
    (C) selecting (i) one or more first input signals, (ii) one or more second input signals, or (iii) a predetermined logic level as one or more output signals in response to said first enable signal and said second enable signal, wherein said first enable signal and said second enable signal have transitions only when said one or more output signals are at said predetermined logic level.

13. The method according to claim 12, wherein said memory comprises a synchronous SRAM.

14. The method according to claim 12, wherein the step (A) further comprises the sub-steps of:
    (A-1) generating a first synchronized control signal by sampling a digital complement of said select signal with said first clock signal;
    (A-2) generating said first signal as a pulse having a pulse width equal to one half of the period of said first clock signal in response to a positive transition of said first synchronized control signal;
    (A-3) generating said second signal as a pulse having a pulse width equal to one half of the period of said second clock in response to a positive transition of, said first signal;
    (A-4) generating a second synchronized control signal by sampling said select signal with said second clock signal;
    (A-5) generating said third signal as a pulse having a pulse width equal to one half of the period of said second clock signal in response to a positive transition of said second synchronized control signal; and
    (A-6) generating said fourth signal as a pulse having a pulse width equal to one half of the period of said first clock in response to a positive transition of said third signal.

15. The method according to claim 12, wherein the step (B) further comprises the sub-steps of:

(B-1) checking a state of a second circuit;

(B-2) if said state of said second circuit is a first state, (i) changing said state of said second circuit to a second state and (ii) setting said first enable signal and said second enable signal to a first logic state upon a positive transition of said first signal;

(B-3) if said state of said second circuit is said second state, (i) changing said second circuit to a third state, (ii) setting said first enable signal to said first logic state, and (iii) setting said second enable signal to a second logic state upon a positive transition of said second signal;

(B-4) if said state of said second circuit is said third state, (i) changing the state of said second circuit to a fourth state and (ii) setting said first enable signal and said second enable signal to said first logic state upon a positive transition of said third signal; and (B-5) if said state of said second circuit is in said fourth state, (i) changing said state of said second circuit to said first state, (ii) setting said first enable signal to said second logic state, and (iii) setting said second enable signal to said first logic state upon a positive transition of said fourth signal.

16. The method according to claim 12, wherein the step (C) further comprises the sub-steps of:

(C-1) generating a logical combination of said first enable signal and said one or more first input signals;

(C-2) generating a logical combination of said second enable signal and said one or more second input signals; and (C-3) generating a logical combination of the result of sub-step (C-1) and the result of sub-step (C-2).

17. The method according to claim 12, wherein:

step (A) further comprises the sub-steps of (A-1) generating a first synchronized control signal by sampling a digital complement of said select signal with said first clock signal, (A-2) generating said first signal as a pulse having a pulse width equal to one half of the period of said first clock signal in response to a positive transition of said first synchronized control signal, (A-3) generating said second signal as a pulse having a pulse width equal to one half of the period of said second clock in response to a positive transition of said first signal, (A-4) generating a second synchronized control signal by sampling said select signal with said second clock signal, (A-5) generating said third signal as a pulse having a pulse width equal to one half of the period of said second clock signal in response to a positive transition of said second synchronized control signal, and (A-6) generating said fourth signal as a pulse having a pulse width equal to one half of the period of said first clock in response to a positive transition of said third signal;

step (B) further comprises the sub-steps of (B-1) checking a state of said second circuit, (B-2) if a second state of said second circuit is a first state, (i) changing said state of said second circuit to a second state and (ii) setting said first enable signal and said second enable signal to a first logic state upon a positive transition of said first signal, (B-3) if said state of said second circuit is said second state, (i) changing said second circuit to a third state, (ii) setting said first enable signal to said first logic state, and (iii) setting said second enable signal to a second logic state upon a positive transition of said second signal, (B-4) if said state of said second circuit is said third state, (i) changing the state of said second circuit to a fourth state and (ii) setting said first enable signal and said second enable signal to said first logic state upon a positive transition of said third signal, and (B-5) if said state of said second circuit is in said fourth state, (i) changing said state of said second circuit to said first state, (ii) setting said first enable signal to said second logic state, and (iii) setting said second enable signal to said first logic state upon a positive transition of said fourth signal; and step (C) further comprises the sub-steps of (C-1) generating a logical combination of said first enable signal and said one or more first input signals, (C-2) generating a logical combination of said second enable signal and said one or more second input signals and (C-3) generating a logical combination of the result of sub-step (C-1) and the result of sub-step (C-2).

* * * * *